(12) United States Patent
Gutmann et al.

(10) Patent No.: US 8,071,261 B2
(45) Date of Patent: Dec. 6, 2011

(54) LITHOGRAPHY MASKS AND METHODS OF MANUFACTURE THEREOF

(75) Inventors: Alois Gutmann, Poughkeepsie, NY (US); Sajan Marokkey, Wappingers Falls, NY (US); Henning Haffner, Pawling, NY (US); Chandrasekhar Sarma, Poughkeepsie, NY (US); Haoren Zhuang, Hopewell Junction, NY (US); Matthias Lipinski, Poughkeepsie, NY (US)

(73) Assignee: Infineon Technologies AG, Neubiberg (DE)

( * ) Notice: Subject to any disclaimer, the term of this patent is extended or adjusted under 35 U.S.C. 154(b) by 355 days.

(21) Appl. No.: 11/781,105

(22) Filed: Jul. 20, 2007

(65) Prior Publication Data
US 2009/0023078 A1    Jan. 22, 2009

(51) Int. Cl.
*G03F 1/00* (2006.01)
(52) U.S. Cl. ............................. 430/5; 430/311
(58) Field of Classification Search .............. 430/5, 311, 430/22; 355/77
See application file for complete search history.

(56) References Cited

U.S. PATENT DOCUMENTS

| | | | |
|---|---|---|---|
| 5,888,674 A | 3/1999 | Yang et al. | |
| 5,935,736 A | 8/1999 | Tzu | |
| 6,048,647 A | 4/2000 | Miyazaki et al. | |
| 6,143,666 A * | 11/2000 | Lin et al. | 438/725 |
| 6,291,113 B1 | 9/2001 | Spence | |
| 6,645,677 B1 * | 11/2003 | Sandstrom | 430/5 |
| 6,830,853 B1 * | 12/2004 | Tzu et al. | 430/5 |
| 7,014,959 B2 | 3/2006 | Crawford et al. | |
| 7,018,934 B2 | 3/2006 | Buie et al. | |
| 2002/0125443 A1 * | 9/2002 | Sandstrom | 250/492.1 |
| 2002/0177078 A1 | 11/2002 | Blatchford, Jr. et al. | |
| 2003/0198878 A1 * | 10/2003 | Minami | 430/22 |
| 2004/0033444 A1 * | 2/2004 | Otoguro et al. | 430/312 |
| 2004/0121242 A1 | 6/2004 | Aleshin et al. | |
| 2004/0265705 A1 | 12/2004 | Stanton et al. | |
| 2005/0089763 A1 * | 4/2005 | Tan et al. | 430/5 |
| 2005/0142461 A1 | 6/2005 | Lee | |
| 2006/0008710 A1 * | 1/2006 | Rolfson | 430/5 |
| 2006/0115748 A1 | 6/2006 | Stanton et al. | |
| 2006/0134529 A1 | 6/2006 | Hansen | |

FOREIGN PATENT DOCUMENTS

| | | |
|---|---|---|
| CN | 1490843 A | 4/2004 |
| CN | 1553282 A | 12/2004 |
| WO | WO98/02782 | 1/1998 |

* cited by examiner

*Primary Examiner* — Mark F Huff
*Assistant Examiner* — Rashid Alam
(74) *Attorney, Agent, or Firm* — Slater & Matsil, L.L.P.

(57) ABSTRACT

Lithography masks and methods of manufacture thereof are disclosed. For example, a method of manufacturing a lithography mask includes forming a stack over a substrate. The stack includes bottom attenuated phase shift material layers, intermediate opaque material layers, and finally top resist layers. The method further includes patterning the stack and then trimming the resist layers to uncover a portion of the opaque material layers. The uncovered opaque material layers are subsequently etched followed by removal of any remaining resist layers.

37 Claims, 8 Drawing Sheets

LITHOGRAPHY MASKS AND METHODS OF MANUFACTURE THEREOF

TECHNICAL FIELD

The present invention relates generally to the fabrication of semiconductor devices, and more particularly to lithography masks used to pattern material layers of semiconductor devices.

BACKGROUND

Generally, semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (ICs). There may be a plurality of transistors, memory devices, switches, conductive lines, diodes, capacitors, logic circuits, and other electronic components formed on a single die or chip, for example.

Optical photolithography involves projecting or transmitting light through a pattern comprising of optically opaque areas and optically clear or transparent areas on a mask or reticle. For many years in the semiconductor industry, optical lithography techniques such as contact printing, proximity printing, and projection printing have been used to pattern material layers of integrated circuits. Lens projection systems and transmission lithography masks are used for patterning, wherein light is passed through the lithography mask to impinge upon a photosensitive material layer disposed on a semiconductor wafer or workpiece. After development, the photosensitive material layer is then used as a mask to pattern an underlying material layer. The patterned material layers comprise electronic components of the semiconductor device.

There is a trend in the semiconductor industry towards scaling down the size of integrated circuits, to meet the demands of increased performance and smaller device size. However, as features of semiconductor devices become smaller, it becomes more difficult to pattern the various material layers because of diffraction and other effects that occur during a lithography process. For example, key metrics such as resolution and depth of focus of the imaging systems may suffer when patterning features at small dimensions.

Lithographic enhancement techniques have been aggressively pursued and adopted to overcome these limitations. These techniques relate to improvements in the optical systems (exposure apparatus), types of masks (phase shift masks, trimming masks, etc.), or the resists. Recently, attenuated phase shifting has been pursued as one means to enhance lithography. However, such enhancements to lithographic techniques may also increase manufacturing costs.

What are needed in the art are lithography masks and methods of manufacture thereof that are cost-effective while still retaining the benefits of lithography enhancing techniques such as attenuated phase shift mask.

SUMMARY OF THE INVENTION

These and other problems are generally solved or circumvented, and technical advantages are generally achieved, by preferred embodiments of the present invention which provide lithography masks and methods of manufacture thereof.

In accordance with a preferred embodiment of the present invention, a method of manufacturing a lithography mask includes forming a stack over a substrate, the stack comprising bottom material layers, intermediate material layers, and finally top resist layers. The method further comprises patterning the stack to reveal a portion of the intermediate material layer. An isotropic etch further etches the sidewalls of the resist layers, thus revealing a further region of the intermediate material layers. The revealed further regions of the intermediate material layers are subsequently etched out. Finally, remaining resist layers are removed from the mask.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1a and 1b show views of a lithography mask formed in accordance with a preferred embodiment, wherein FIG. 1a shows the cross-sectional view and FIG. 1b shows the top view;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1A:
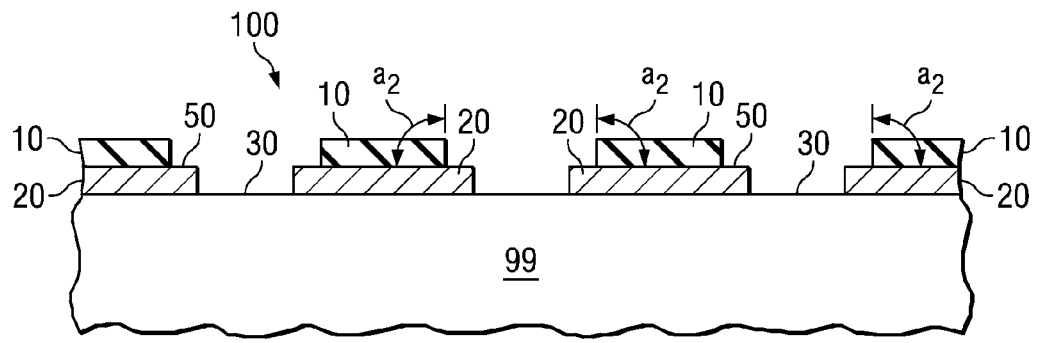

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Attenuated phase shifting technique is a specific phase shifting, where the incident light passing through a first region is phase shifted by about 180 degrees compared to a second neighboring region. The images from the two regions destructively interfere near the edge of the first and second regions and result in a clear separation between the images. Thus, the edge of the unexposed to the exposed region can be defined with higher precision. Ideally, the light passing through the first region is too low in intensity to expose the resist under the first region. However, when features are printed onto a wafer having a width near the resolution limit of the optical system, the intensity distribution in certain areas under the attenuated region may increase due to interference effects and expose the underlying resist. This results in the formation of unwanted side lobes near the main feature in the resist.

A number of solutions exist in the art for the removal of side lobes. However, mask making is extremely expensive due to the required process precision and complexity. Hence, solutions that increase either the complexity or cost of mask making are unattractive choices. For example, a second or additional pattern step may be used to cover the mask with opaque material at positions where undesired side lobe intensity would otherwise appear and thus avoid the unwanted side lobes. However, introduction of a second resist patterning step in the fabrication of the mask results in decreased throughput of the mask manufacturing process, further increasing the cost of mask making. Further, the first and second patterns may not be aligned on top of each other creating mask errors or fluctuations in patterns. Fluctuations of mask-pattern dimensions often have a multiplied pattern profile impact on the wafer surface, especially for structures with dimensions close to the resolution limit that typically bear high MEEF (Mask Error Enhancement Factor) values, requiring increased inspections, repairs, etc., and driving costs further up. The current invention describes a novel process for mask making without considerable increase in complexity or expense.

Embodiments of the present invention achieve technical advantages by providing lithography mask designs and methods of manufacture thereof wherein a single resist patterning step may be used to form a lithography mask, whereby the mask is used to pattern features on a semiconductor device. The present invention will be described with respect to preferred embodiments in a specific context, namely the method of forming an attenuated phase shifting mask to print closely spaced contacts. The invention may also be applied, however, to the printing of other small devices and structures in addition to contacts using standard photolithography techniques and standard and/or off-axis illumination. For example, the invention may also be applied to masks used to pattern other types of devices in other applications and other technological fields.

Figure 2A:
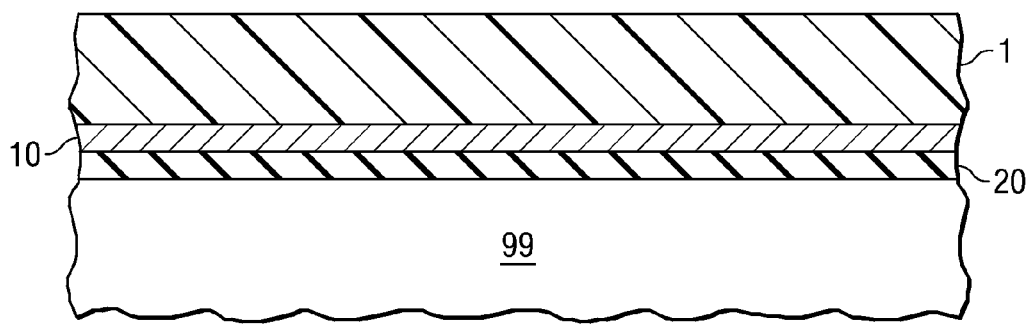
FIGS. 2a-2f show cross-sectional views of an attenuating phase shifting lithography mask in accordance with a first embodiment of the present invention at various stages of manufacturing.
Figure 2B:
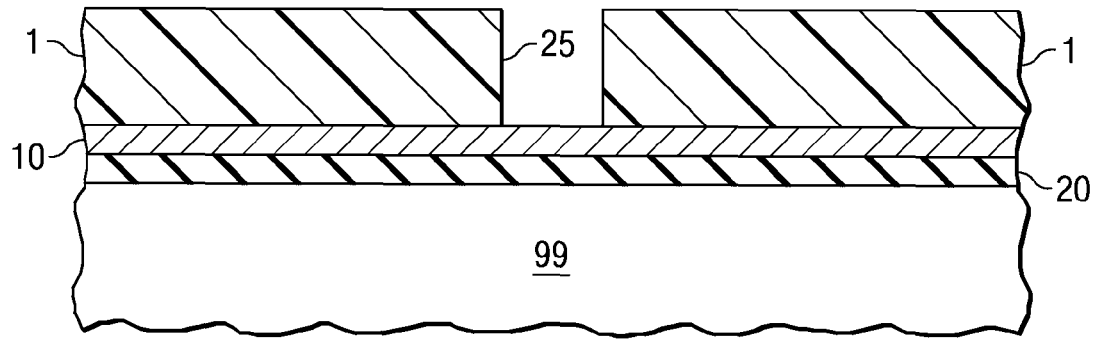
Figure 2C:
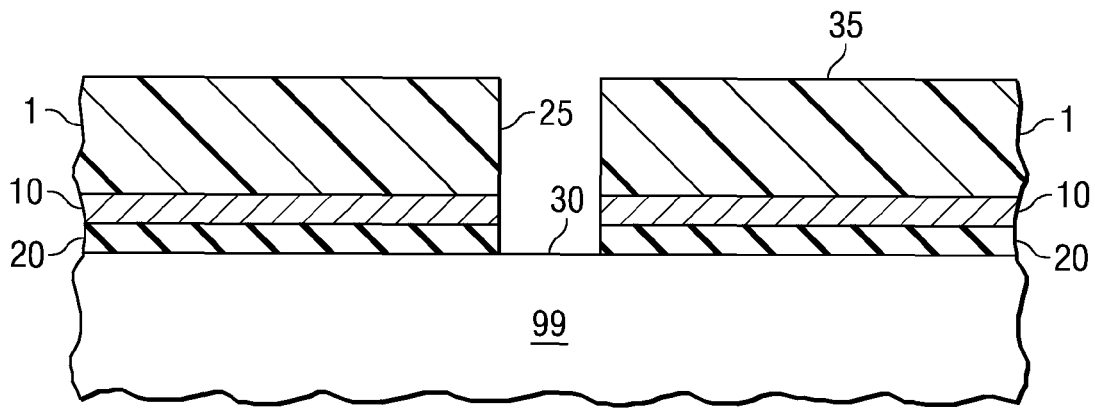
Figure 2D:
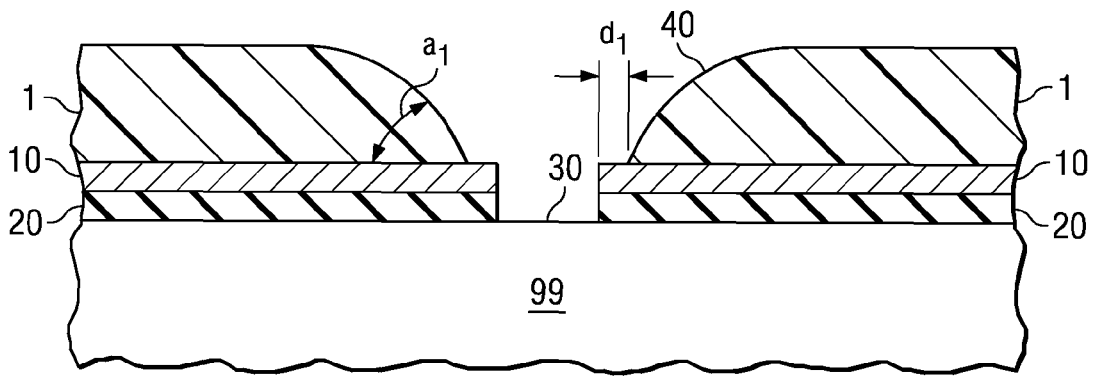
Figure 2E:
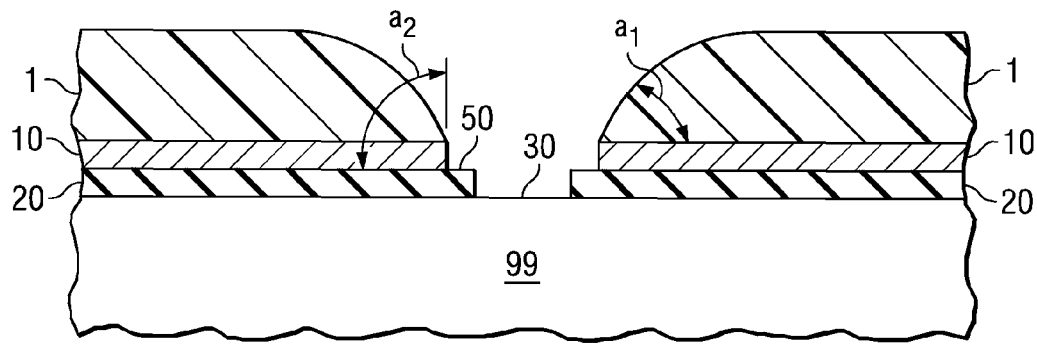
Figure 2F:
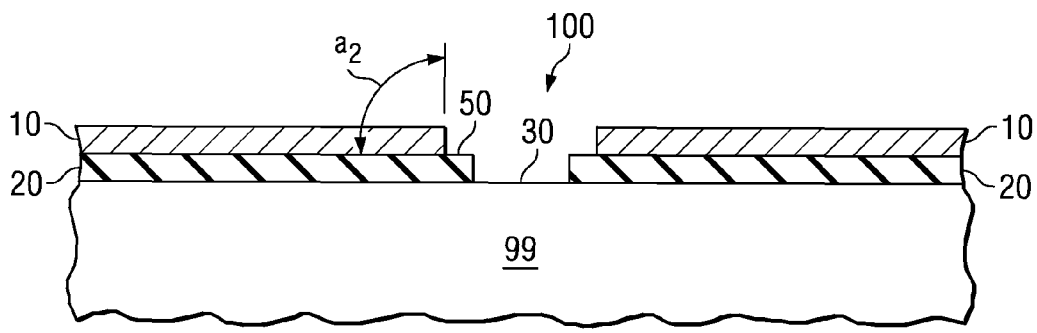
Figure 3:
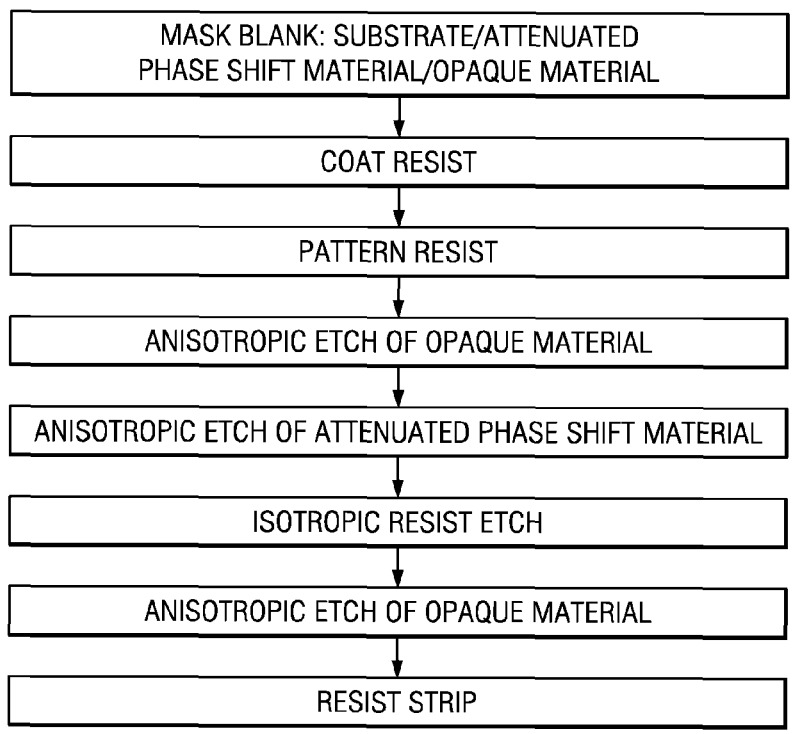
FIG. 3 shows a flow chart of the process steps of manufacturing the lithography mask in accordance with the first embodiment of the present invention.
Figure 5A:
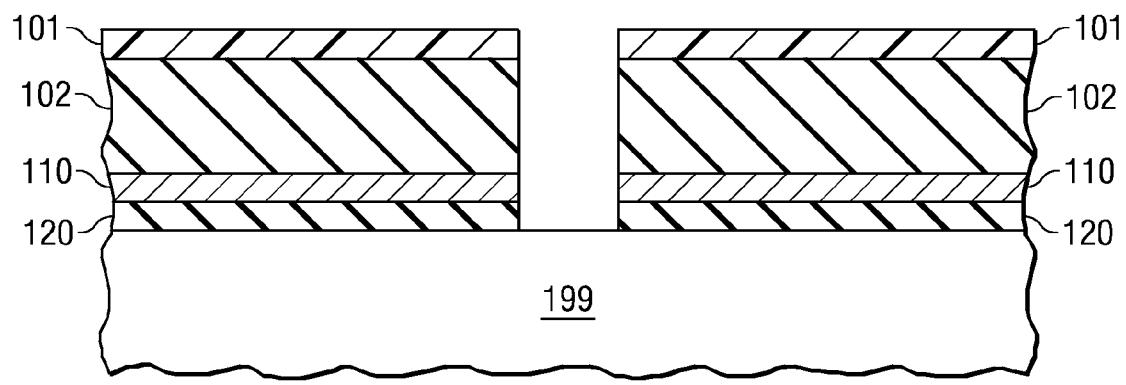
FIGS. 5a-5b show cross-sectional views of an attenuating phase shifting lithography mask in accordance with an additional option of the second embodiment of the present invention at various stages of manufacturing.
Figure 5B:
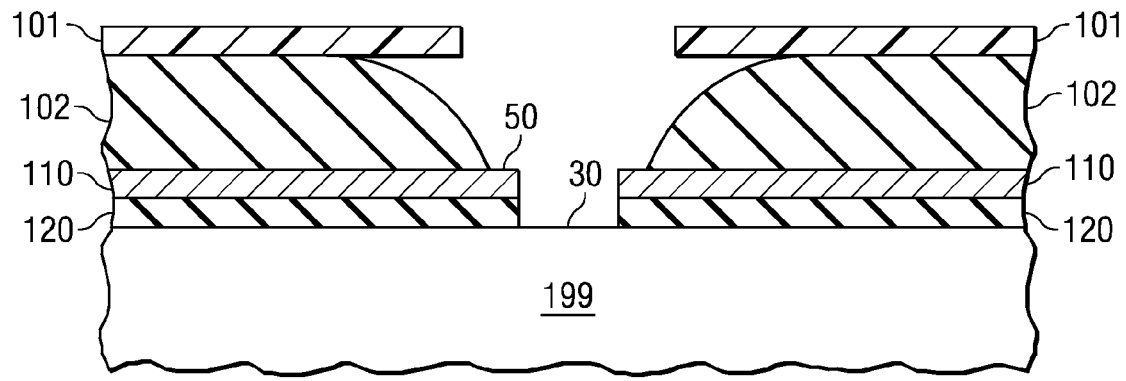
Figure 6:
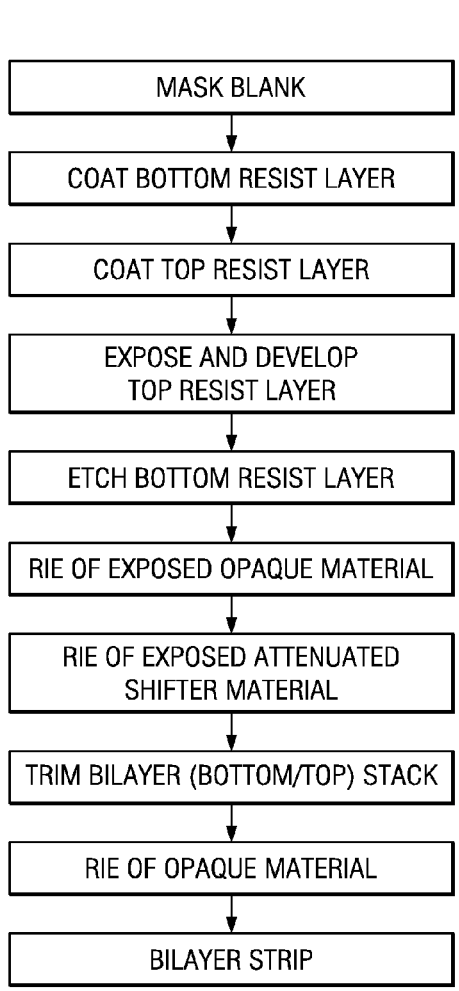
FIG. 6 shows a flow chart of the process steps of manufacturing the lithography mask in accordance with the second embodiment of the present invention.
Figure 8:
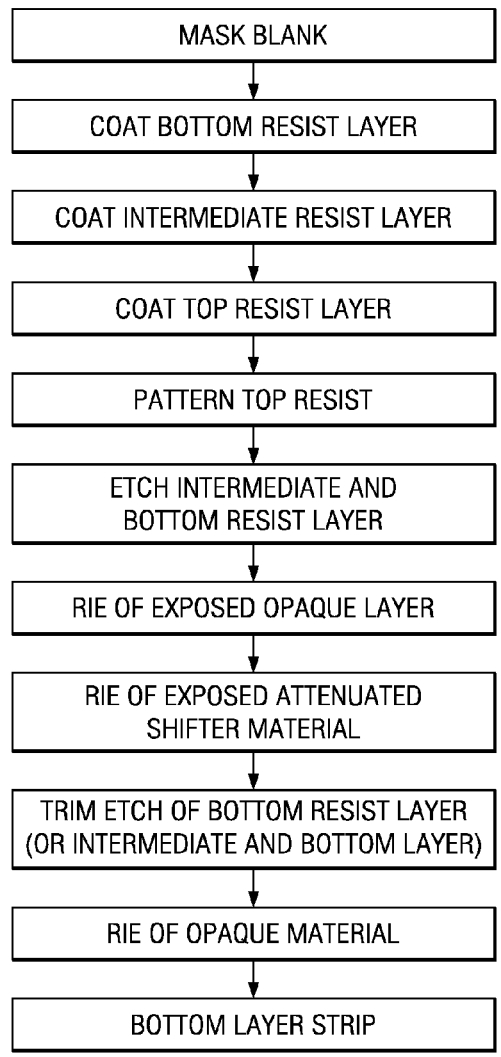
FIG. 8 shows a flow chart of the process steps of manufacturing the lithography mask in accordance with the third embodiment of the present invention.
Figure 9:
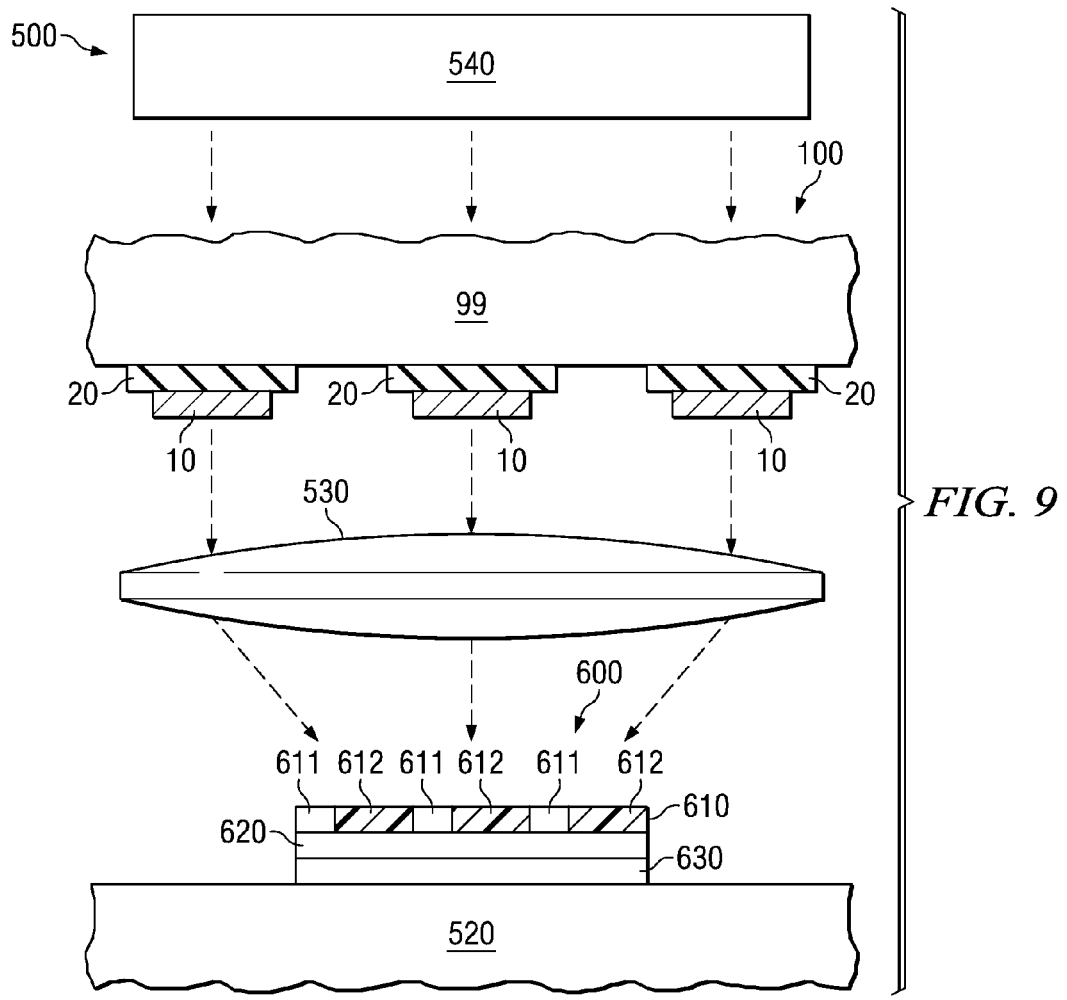
FIG. 9 shows a lithography system implementing a lithography mask of FIG. 1 (or FIGS. 2f, 4d, or 7d) in accordance with a preferred embodiment of the present invention.

An exemplary lithography mask manufactured using the method described by the current invention is shown in FIG. 1 and various methods for the formation of lithography mask using embodiments of the current invention will then be described with respect to the cross-sectional views of FIGS. 2a-2f and FIGS. 4a-4d, FIGS. 5a-5b, FIGS. 7a-7d, and the flow charts of FIGS. 3, 6, and 8. FIG. 9 describes the use of the manufactured lithography mask in a lithography stepper. Further, FIGS. 10 and 11 describe the use of the said stepper in forming semiconductor devices.

Figure 1B:
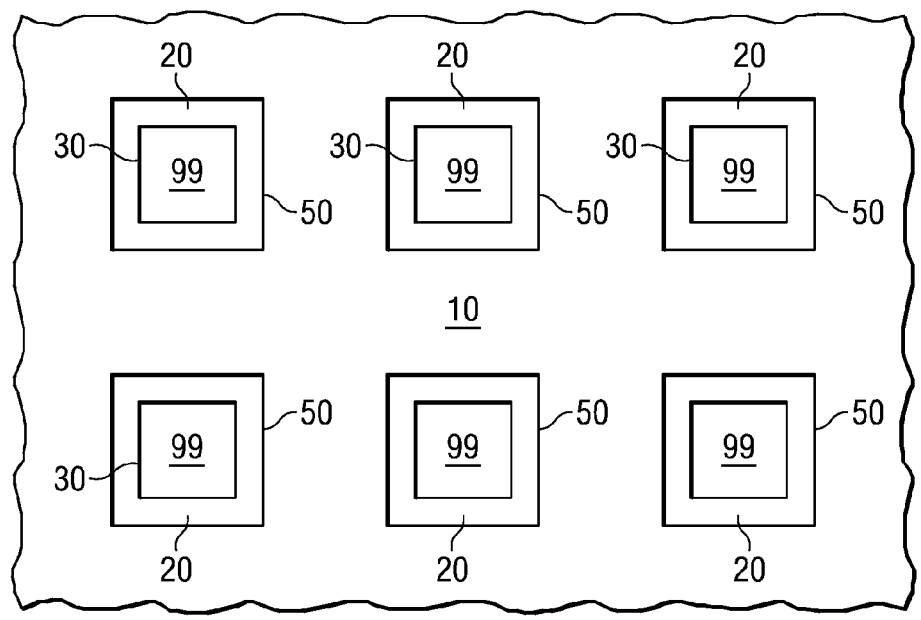

FIGS. 1a and 1b show cross-sectional and top-down views of a lithography mask 100 manufactured in accordance with a preferred embodiment of the present invention. With reference now to FIG. 1a, first, a substrate 99 is provided. An attenuated phase shift material layer 20 is disposed on top of the substrate 99. An opaque material 10 is further disposed atop the attenuated phase shift material layer. An opening 50 on the opaque material reveals the attenuated phase shift material layer. The sidewalls of the opening 50 may not be vertical and form an angle $a_2$ to the surface of the substrate 99. This angle $a_2$ may be less than 90 degrees. Further, a smaller opening 30 is disposed on the attenuated phase shift material layer 20 that reveals the substrate 99.

FIG. 1b is a top cross-section of the mask 100. The plurality of openings 30 are disposed in the opaque material 10 and reveal the substrate 99. The openings 30 are surrounded by larger openings 50 that reveal a ring of attenuated phase shift material layer 20 around the substrate 99.

A preferred embodiment process flow will now be discussed for fabricating the lithography mask described in FIG. 2. A flow chart of the described process flow is shown in FIG. 3. As one advantageous feature, the lithography mask is formed without an additional or second resist patterning step. Further, due to the use of just a single resist patterning step, the resultant rim-like features on the mask are self-aligned. Hence, fluctuations in exposed features arising from the introduction of the disclosed mask fabrication process are minimal.

FIG. 2, which includes FIGS. 2a-2f, illustrates the formation of the lithography mask using a first embodiment of the current invention. Referring first to FIG. 2a, a mask blank is provided. In a particular example, the mask blank is a tri-tone mask blank, comprising a substrate 99, an attenuated phase shift material (also called half tone) layer 20 over the substrate and an opaque layer 10 over the attenuated phase shift material layer 20. A resist layer 1 is deposited covering the opaque layer 10.

In the embodiment shown in FIGS. 2a-2f, the substrate 99 preferably comprises a transparent material such as quartz, although alternatively the substrate 99 may comprise other materials, such as fluorinated quartz, calcium fluoride, hafnium oxide, borofloat, or sodalime glass, as examples. The substrate 99 preferably comprises a thickness of about ¼ inch, for example, although alternatively, the substrate 99 may comprise other dimensions.

The thickness of the attenuated phase shift material layer 20 is carefully selected to attain an optical path difference of about half the wavelength of light waves passing through the phase shifter relative to the light waves passing through the substrate. Consequently, resulting in a phase difference of about 180 degrees between the waves. Further, the transmittance through the attenuated phase shift material layer 20 is selected to be about 4% to about 40% and preferably about 6%. Hence, the thickness of the attenuated phase shift material layer 20 is suitably selected based on both the wavelength of the incident light and the refractive index of the substrate 99. The attenuated phase shift material layer 20 preferably comprises a thickness of about 100 nm or less, and more preferably for use with a 193 nm incident light, comprises a thickness of about 40 nm to about 60 nm. In some embodiments, although alternatively, the attenuated phase shift material layer 20 may comprise other dimensions. For example, the thickness of the attenuated phase shift material layer 20 may decrease if a lower wavelength, e.g. 157 nm, is used.

The attenuated phase shift material layer preferably comprises an oxide of MoSi, although other materials may also be used. For example, in other embodiments, attenuated phase shift material layer 20 may comprise TaSiO, TiSiN, MoSiN, TaN, and/or ZrSiO. The attenuated phase shift material layer may either be a single layer or a multi-layer stack. For example, in an alternate embodiment, a multi-layer stack comprising TaN and $Si_3N_4$ or Mo and Si may be the attenuated phase shift material layer 20.

The opaque material 10 comprises an absorbing material or an absorber. The thickness of the opaque material is carefully selected to absorb most of the incident light. The opaque material 10 preferably comprises chromium (Cr) in some embodiments, although alternatively, the opaque material 10 may comprise other metals or metallic compounds such as Ta, TaN, Au, Ti, Ga, W, Ni, Sn, $SnO_2$, or other materials such as Si, Ge, C, and $Si_3N_4$. Similarly, the opaque material 10 may be a single layer or a multi-layer stack. The preferred opaque material comprises a stack of chromium oxide on chromium. For example, in a specific embodiment, the opaque material may be a 5 nm chromium oxide ($Cr_2O_3$) film over a 70 nm chromium (Cr) film. The opaque material 10 preferably comprises a thickness of about 50 nm to about 100 nm or less, although alternatively, the opaque material 10 may comprise other dimensions. In some embodiments, an intermediate capping or buffer layer may be present between the attenuated phase shift material layer 20 and the opaque layer 10. As is evident from the above discussion, any suitable material stack that has the correct combination of transmittance and refractive indices may be used to form the mask blank layers (substrate 99, attenuated phase shift material layer 20, and the opaque layer 10).

Although, in the current embodiment, only an opaque layer 10 and attenuated phase shift material layer 20 are discussed, other suitable layers may also be included. For example, an antireflective layer is typically included in the mask. The anti-reflective layers are used to avoid interference from reflected radiation from underlying layers. In various embodiments, this anti-reflective layer may be included in any combination, such as either between the opaque layer 10 and the attenuated phase shifter material layer 20, above the opaque layer 10 or between the substrate 99 and the attenuated phase shifter material layer 20.

The resist layer 1 is a resist that can be developed by exposure to radiation such as electrons. For example, resist layer 1 may either be sensitive to an electron radiation or an electromagnetic radiation such as a deep UV radiation. Preferred embodiments use an electron beam or deep UV resist, although any suitable resist depending on the type of the subsequent exposure process may be used. In different embodiments, either positive or negative tone resists may be used. Examples of resist polymers are poly-p-hydroxystyrene, acrylates, novolak, or cycloaliphatic copolymers.

Referring now to FIG. 2b, the resist is exposed to radiation and developed using standard lithography techniques to uncover or reveal opaque material 10 and thus open a hole 25 in the mask blank.

As shown in FIG. 2c, the uncovered opaque material 10 and the underlying attenuated phase shift material layer are then etched using a standard anisotropic etch process such as reactive ion etch (RIE) process. The RIE process is preferably optimized to minimize roughness of the mask layer sidewalls 25. The RIE may use a suitable etchant to realize good etch selectivity relative to the resist 1. For example, if the etch selectivity for the opaque material 10 relative to the resist 1 is about 1.5, some portion of the resist 1 may also be removed.

In the preferred embodiment, a chlorine based etch chemistry such as $CCl_4/O_2$ or $Cl_2/HCl/O_2$ may be used. However, other suitable etch chemistries may also be used in other embodiments.

The attenuated phase shift material layer 20 is then etched in a second RIE process using a second gas chemistry. The gas chemistry is chosen to have good selectivity for the attenuated phase shift material layer 20 without etching other regions (opaque material 10, resist 1, and substrate 99) considerably. The second RIE process may have a timed over-etch to ensure removal of the attenuated phase shift material layer 20 and reveal the underlying substrate 99. As in the previous case, the RIE process to remove the attenuated phase shift material layer 20 may also remove a part of the resist 1. The preferred etch chemistry comprises $CF_4/O_2$, whereas in other embodiments other etch chemistries such as $SF_6/O_2$, $SF_6/H_2$, $CF_4/He$, $CH_3F/O_2$, and $CF_4/O_2/N_2$ may also be used.

Referring next to FIG. 2d, the mask is subjected to a trim etch. The trim etch may be an isotropic etch or a partly isotropic etch. The trim etch selectively removes the resist 1 and attacks both the top surface 35 and sidewalls 25 of the resist 1. Consequently a part of the resist 1 over the opaque material is etched out.

The trim etch may either be a wet etch or a dry plasma etch, although the preferred embodiment uses a dry plasma etch. The plasma etch may be isotropic or partially isotropic depending on the selected etchant chemistry. The etch chemistry is selected based on the material of the resist 1. The plasma etch may also be made more isotropic by a suitable combination of the plasma input parameters such as gas pressure, source gas flow, and plasma power. For example, decreasing the gas pressure may result in a more anisotropic etch. In various embodiments, the trim etch may comprise an oxygen based etch chemistry ($O_2/N_2$ or $O_2/Ar$), as well as fluorine-containing gases ($CF_4$, $NF_3$, $SF_6$, etc.), a reductive chemistry ($N_2/H_2$) or combination thereof (i.e. $O_2/CF_4$).

In some embodiments, a wet etch chemistry may also be used. For example, the wet isotropic etch may comprise a combination of HF followed by phosphoric acid dip.

The nature of the trim etch (for example the relative ratio of the vertical etch rate to the lateral etch rate) determines the resist 1 layer's sidewall angle $a_1$. In different embodiments, a trim etch time may be varied to suitably adjust the lateral trim distance $d_1$ in FIG. 2d to a desired length.

As shown in FIG. 2e, the uncovered opaque material layer 10 is etched and removed. This etch reveals the attenuated phase shift material layer 20 around the region 50 and may be similar to the previous opaque material layer 10 etch. The sidewall angle $a_1$ of the resist 1, may impact the sidewall angle $a_2$. For instance, a tapered resist profile ($a_1$ smaller than 90 degree) may result in a tapered sidewall profile of opaque material layer 10. Finally as shown in FIG. 2f, the resist 1 is removed using a standard etch step, forming the mask.

A second and third embodiment of the current invention will now be described using FIGS. 4a-4d, FIGS. 5a-5b, and FIGS. 7a-7d. The flow charts of FIG. 6 and FIG. 8 further describe the second and third embodiments. The bi-layer and tri-layer resists enable patterning of finer or smaller geometries. By replacing the single layer resist 1 of FIG. 1 a by multiple layers, the top radiation sensitive layer may be made thinner to improve variability as well as resolution of the exposed pattern. In various embodiments, until completion of all process steps, the mask fabrication requires a resist layer covering all regions open or exposed to etching, except the uncovered or patterned regions. However, in some instances, the various etch steps, such as the sequence of anisotropic and isotropic steps, may deleteriously remove the required single layer resist 1 before completion of the mask fabrication process. In fact, the likelihood of unintentionally removing this layer increases as the resist thickness is decreased to meet the enhanced variability and resolution requirements.

Embodiments of the present invention will now be discussed using these multi-layer resists. A second embodiment will first be described using a bi-layer resist followed by a third embodiment using a tri-layer resist scheme.

Figure 4A:
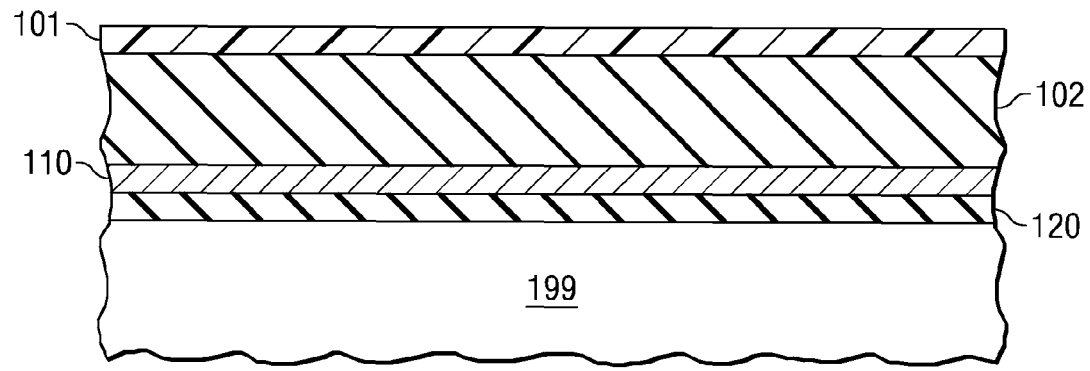
FIGS. 4a-4d show cross-sectional views of an attenuating phase shifting lithography mask in accordance with a second embodiment of the present invention at various stages of manufacturing.

In the second embodiment of the current invention, a bi-layer scheme is used. Referring first to FIG. 4a, a mask blank is provided comprising a substrate 199, an attenuated phase shift material layer 120 on top of the substrate, an opaque layer 110 on top of the attenuated phase shift material layer 120, and a bi-layer 101/102 covering the opaque layer 110. The bi-layer system comprises a top layer 101 on a bottom layer 102. For example, top layer 101 may be a top resist that can be patterned with radiation such as electron-beam or deep ultra violet radiation. The bottom layer 102 may be either organic or inorganic. Some examples of inorganic bottom layer 102 include silicon dioxide, silicon nitride, silicon oxynitride, titanium nitride, and/or a SILK (silicon-containing low-k) layer. The bottom layer 102 may also be an organic layer such as a bottom anti-reflective coating (BARC) layer (such as polymides, polysulfones), a FLARE layer, and/or a BCB layer. The bottom resist layer 102 is baked to form a hard baked, possibly thermally or chemically cross-linked resist. The top resist 101 in a preferred embodiment is about 120 nm and the bottom resist 102 is about 500 nm. However, the top resist 101 on other embodiments may be between about 20 nm to about 1000 nm. The bottom resist 102 may in other embodiments be between about 200 nm to about 2000 nm.

Figure 4B:
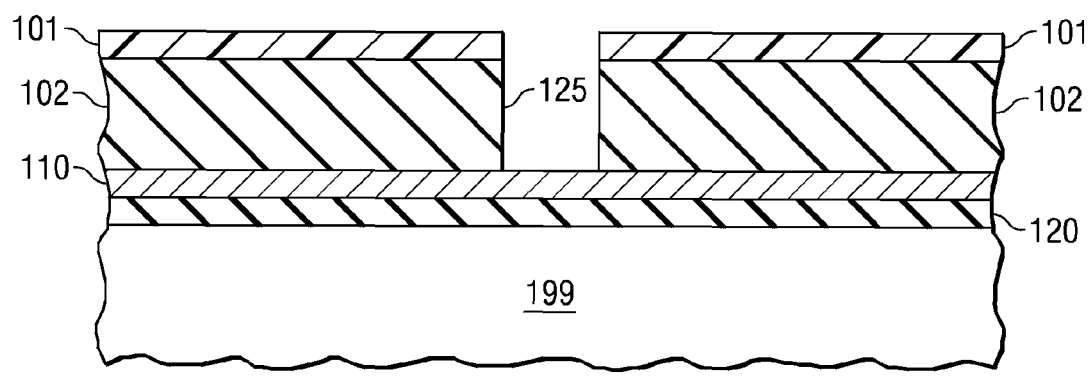

Referring now to FIG. 4b, the top resist layer 101 is exposed to radiation, developed, and etched using standard lithography techniques. The bottom layer 102 is etched using the top layer 101 as a mask, using a reactive ion etcher. The RIE gas chemistry may comprise $O_2/N_2$ or $O_2/SO_2$ if the bottom layer 102 is organic material, or another chemistry suitable for inorganic bottom layers. The RIE etch uncovers a portion of the opaque layer 110 through opening 125. Different RIE steps as described above etch the opaque layer 110 and attenuated phase shift material layer 120. The etch chemistry is likely to be different from the previous case due to the different resist stack. As before, the etch chemistry is selected to minimize unwanted etching of other open regions.

Figure 4C:
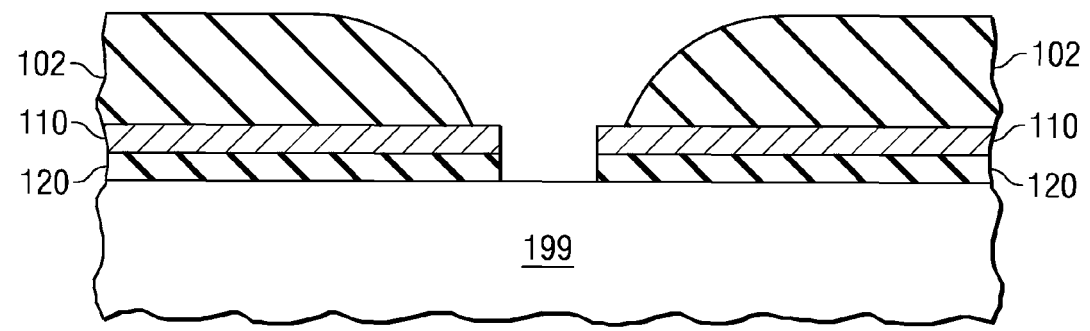

As shown in FIG. 4c, the trim etch follows the RIE etch of the attenuated phase shift material layer 120. The trim etch is an isotropic or semi-isotropic etch. In the preferred embodiment, the thin top layer 101 is completely removed in previous RIE steps and does not exist during the trim etch.

However in some embodiments, the top layer 101 may still be present (as shown in FIG. 5a). In such cases, since there are two layers, the etch selectivity may be different between the two layers. The etch chemistry is selected to trim the bottom resist layer 102 as shown in FIG. 5b in a controlled manner. Typically, the top layer 101 is also thinned vertically down during the trim etch. The lateral loss of the top layer 101, preferably, is sufficient to avoid undesirable shadowing effects, especially, if a dry etch process is used during subsequent etching of layer 102. In some embodiments, overhang of top layer 101 (lateral protrusion of top layer 101 over the bottom layer 102) may be tolerable especially if this overhang distance is small.

In other embodiments, two different isotropic etch chemistries may be used for trimming the top resist layer 101 and bottom resist layer 102. For example, the top resist layer 101 may be etched with the first chemistry, followed by a second etch chemistry to etch the bottom resist layer 102.

Figure 4D:
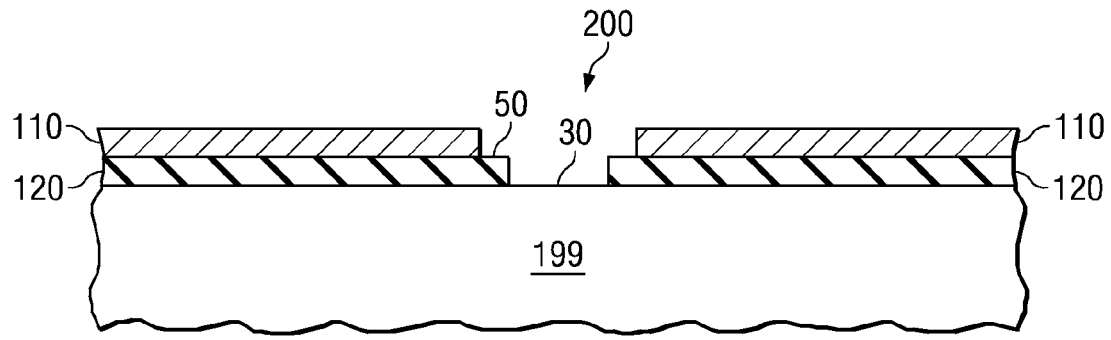

As shown in FIG. 4d, the uncovered opaque material 110 is etched and removed. Finally, the remainder of the bi-layer system is removed using one or several standard etch steps, forming the lithography mask 200.

Figure 7A:
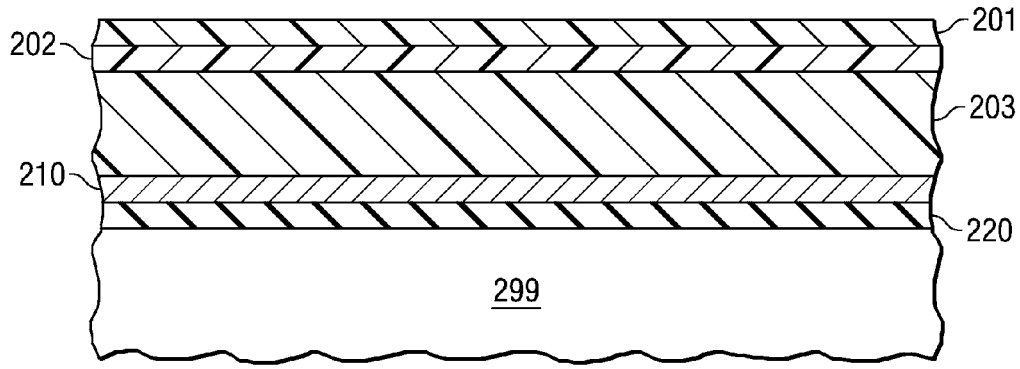
FIGS. 7a-7d show cross-sectional views of an attenuating phase shifting lithography mask in accordance with a third embodiment of the present invention at various stages of manufacturing.

In a third embodiment of the current invention, a tri-layer resist is used. Referring first to FIG. 7a, a mask blank is provided comprising a substrate 299, an attenuated phase shift material layer 220 on top of the substrate, and an opaque layer 210 on top of the attenuated phase shift material layer 220.

A tri-layer resist layer 201/202/203 is formed covering the opaque layer 210. The resist layer comprises three layers: a bottom layer 203 on the substrate 299, a middle layer 202 and a top layer 201 on top of a middle layer 202. For example, 201 may be a patternable resist. The middle layer 202 may, for example, be a silicon containing material such as silicon anti-reflective coating (Si ARC). The Si ARC material typically comprises a $SiO_xC_y(N_y)$ type compound, although other suitable anti-reflective material may be used in case certain etch selectivity requirements are met. The anti-reflective coating is used to avoid reflected radiation from the underlying layers such as the opaque layer 210. The reflected radiation from these underlying layers may result in additional interference patterns and result in line width variations in the top layer 201 exposed to radiation. The bottom resist layer 203 may be a hard baked organic dielectric layer (ODL).

The top resist 201 functions as mask for etching the middle layer 202 which functions, besides its role as reflection suppressant, as the masking material for etching the comparatively thicker bottom layer 203.

The top resist 201 in a preferred embodiment is about 230 nm the intermediate resist 202 is about 120 nm, and the bottom resist 203 is about 500 nm. However, the top resist 201 on other embodiments may be between about 20 nm to about 1000 nm. The intermediate resist 202 may in other embodiments be between about 20 nm to about 500 nm. The bottom resist 203 may in other embodiments be between about 200 nm to about 2000 nm. The formation of the resist layer may include bakes or anneals after deposition of each layer.

Figure 7B:
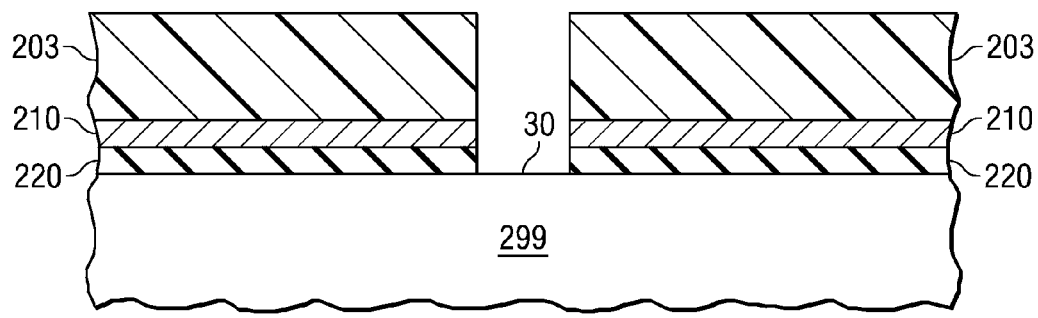

Referring now to FIG. 7b, the top resist layer 201 is exposed to radiation and developed, using standard lithography techniques. The intermediate resist layer 202 and bottom resist layer 203 of the tri-layer system are etched employing the top resist layer 201 as a mask, using for example a reactive ion etch. The RIE gas chemistry may comprise $CF_4/CH_2F_2$ for etching the intermediate resist layer 202, and $O_2/CO$, $O_2/CO_2$ or $O_2/Ar$ mixtures for etching the bottom resist layer 203. In other embodiments, this gas chemistry may however comprise other suitable etchants. The RIE etch uncovers a portion of the opaque layer 210 through opening created by the previous etch. A different RIE etches the opaque layer 210 and attenuated phase shift material layer 220. A suitable etch chemistry, as discussed in previous RIE steps, may be used. However, in some embodiments, the etch chemistry is likely to be different from the previous case due to the different resist stack. As before, the etch chemistry is selected to minimize unwanted etching of other open regions (or optimizes selectivity). The thin top and intermediate resist layers 201 and 202 may be completely removed by these RIE etches.

Figure 7C:
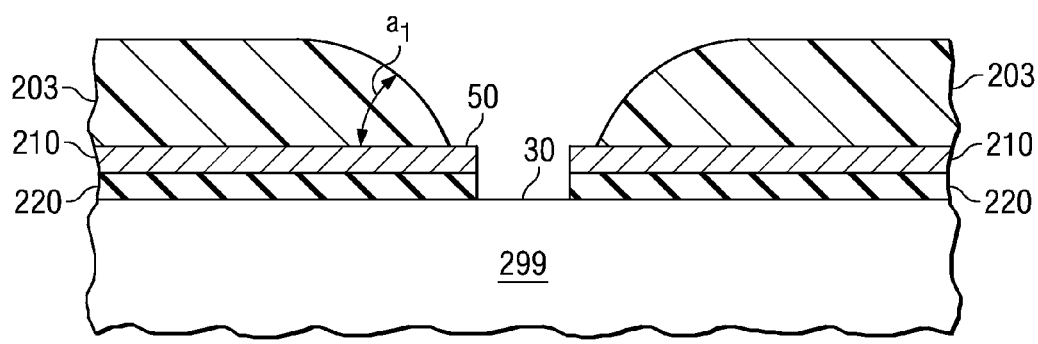

As shown in FIG. 7c, the trim etch follows the RIE etch of the attenuated phase shift material layer 220. The trim etch is an isotropic or semi-isotropic etch. If the top or intermediate layers are still present, the etch chemistry is carefully selected to remove all the layers at an equal rate to promote the formation of a high angle side wall $a_1$. However in some cases, it may be necessary to use two or three different isotropic etch chemistries. The top layer 201 may be etched with the first chemistry, followed by a second etch chemistry to etch the intermediate layer 202, and a third etch chemistry to etch the bottom layer 203.

Figure 7D:
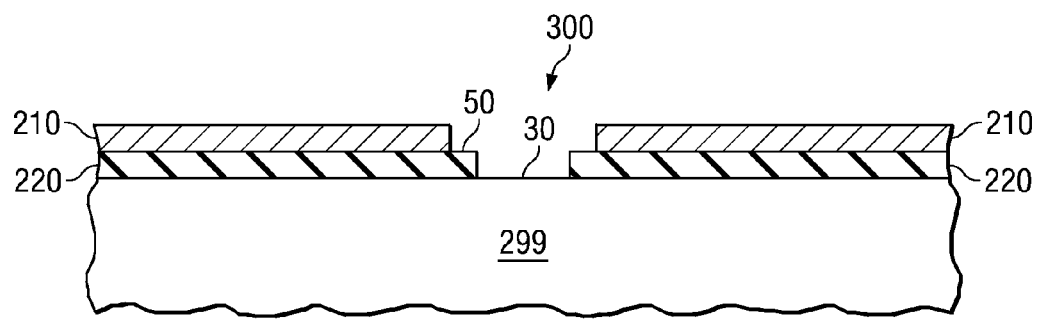

As shown in FIG. 7d, the uncovered opaque layer 210 is etched and removed. Finally the bottom resist layer 203 is removed using a standard etch step, forming the photomask 300.

Figure 10:
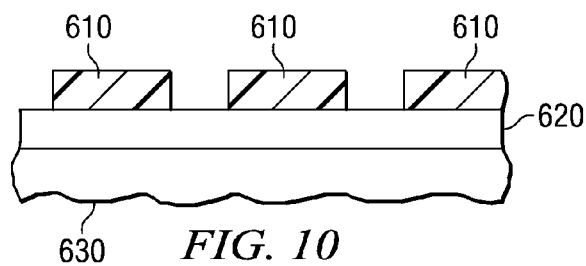
FIG. 10 shows a cross-sectional view of a semiconductor device that has a layer of photo resist disposed thereon that has been patterned using a lithography mask of an embodiment of the present invention.
Figure 11:
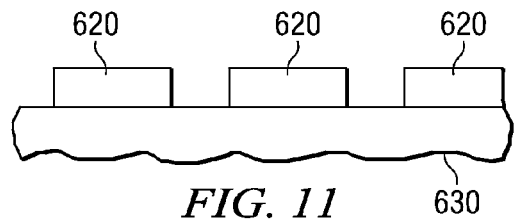
FIG. 11 shows the semiconductor device of FIG. 10 after the layer of photoresist has been used as a mask to pattern a material layer of the semiconductor device.

Embodiments of the present invention include methods of manufacturing semiconductor devices and devices manufactured using the lithography masks 100 described herein. FIG. 9 describes a lithography system implementing the mask manufactured using embodiments of the current invention. FIG. 10 shows a cross-sectional view of a semiconductor device 600 of FIG. 9, and has a layer of photoresist 610 disposed thereon that has been patterned using a lithography mask 100 of FIG. 1. FIG. 11 shows the semiconductor device of FIG. 10 after the layer of photoresist 610 has been used as a mask to pattern a material layer 620 of the semiconductor device.

FIG. 9 shows a lithography system 500 implementing a lithography mask 100 of FIG. 2f. Embodiments of the present invention also include lithography systems 500 such as the one shown in FIG. 9 that utilize or include the lithography masks 200, and 300 as shown in FIGS. 4d, or 7d, respectively, as examples.

Referring to FIG. 9, the lithography system 500 includes a support or stage 520 for a semiconductor device 600 or workpiece and a projection lens system 530 disposed proximate the semiconductor device 600 and support 520, as shown. The projection lens system 530 may include a plurality of lenses, e.g., not shown, and may include a fluid disposed between the semiconductor device 600 mounted on the support 520 and a last lens of the projection lens system 530, e.g., in an immersion lithography system, not shown. An illuminator 540 comprising an energy source, e.g., a light source, is disposed proximate the projection lens system 530.

The lithography system 500 may comprise a lithography system that utilizes near ultraviolet (UV) or preferably deep ultraviolet (UV) light; e.g., light with wavelengths of 248 nm, 193 nm, or 157 nm, although light having other wavelengths may also be used. The lithography system 500 may comprise a stepper or a step-and-scan apparatus, wherein the stage 520 is adapted to move the semiconductor device 600 while the mask 100 is moved in the exposure process, for example. The lithography system 500 may also be adapted for immersion lithography applications, for example, not shown.

Referring to FIG. 9, the semiconductor device 600 includes a workpiece 630. The workpiece 630 may include a semiconductor substrate comprising silicon or other semiconductor materials covered by an insulating layer, for example. The workpiece 630 may also include other active components or circuits, not shown. The workpiece 630 may comprise silicon oxide over single-crystal silicon, for example. The workpiece 630 may include other conductive layers or other semiconductor elements, e.g., transistors, diodes, etc. Compound semiconductors, GaAs, InP, Si/Ge, or SiC, as examples, may be used in place of silicon. The workpiece 630 may comprise a silicon-on-insulator (SOI) substrate, for example.

The present invention in an embodiment describes a method using the mask 100 to fabricate a semiconductor device 600. A sequence of process steps used in the formation of the semiconductor device 600 will now be described. A material layer 620 to be patterned is deposited over a workpiece 630. The material layer 620 may comprise a conductive, insulating, or semiconductive material, or multiple layers or combinations thereof, as examples. In some embodiments, the material layer 620 preferably comprises a semiconductive material such as silicon or polysilicon, for example, although other materials may also be used. In an embodiment where transistors are formed, the material layer 620 may comprise a gate dielectric material comprising an insulator and a gate material formed over the gate dielectric material, for example.

A layer of photosensitive material 610 is deposited over the material layer 620. The layer of photosensitive material 610 may comprise a photoresist, for example.

The layer of photosensitive material 610 is exposed to light using the lithography mask 100. The light from the illuminator 540 of FIG. 9, passing through the attenuated phase shift material 20 via the opening of the mask 100 is phase shifted by about 180 degrees relative to the light passing through open window 99 of mask 100. The resulting electric field of light transmitted through the attenuated phase shift region is opposite to the electric field of the un-shifted light. The resulting intensity due to destructive interference between the two waves results in improved printing of small features 611 on the semiconductor device 600. Further, the presence of the opaque layer (for example in regions 10 of the mask 100 in FIG. 1b) avoids unwanted development of regions 612 of the semiconductor device 600 underlying the opaque layer 10 of the mask 100.

The layer of photosensitive material 610 is patterned using the lithography mask 100 of FIG. 1b (or masks 100, 200, 300 of FIGS. 2f, 4d, 7d respectively) to form a latent pattern 610 for the plurality of features to be formed in the material layer 620. The layer of photosensitive material 610 is developed, as shown in FIG. 10.

In some embodiments, the layer of photosensitive material 610 is used as a mask while the material layer 620 is etched using an etch process, forming a plurality of features in the material layer 620, as shown in a cross-sectional view in FIG. 10. The layer of photosensitive material 610 is then removed. The plurality of features in the material layer 620 may be contact holes.

In other embodiments, the layer of photosensitive material 610 is used as a mask to affect an underlying material layer 620 of the semiconductor device 600, for example. Affecting the material layer 620 may comprise etching away uncovered portions of the material layer 620, implanting a substance such as a dopant or other materials into the uncovered portions of the material layer 620, or forming a second material layer over uncovered portions of the material layer 620, as examples (not shown), although alternatively, the material layer 620 may be affected in other ways. Further processing of the workpiece 630 using conventional semiconductor manufacturing techniques forms the semiconductor device 600.

Features of semiconductor devices 600 manufactured using the novel methods described herein may comprise transistor gates, conductive lines, vias, capacitor plates, and other features, as examples. Embodiments of the present invention may be used to pattern features of memory devices, logic circuitry, and/or power circuitry, as examples, although other types of ICs and devices may also be fabricated using the manufacturing techniques and processes described herein.

Embodiments of the present invention may be used in lithography processes that utilize positive or negative photoresists for patterning semiconductor devices 600, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a lithography mask, the method comprising:
    forming a resist layer over a second layer, the second layer disposed over and physically in contact with a first layer, the first layer comprising a phase shift material layer, and the first layer disposed over a substrate;
    patterning the resist layer to reveal portions of the second layer;
    using the patterned resist layer as a mask to remove the revealed portions of the second layer and then underlying portions of the first layer;
    etching the resist layer using a partially isotropic plasma etch, to uncover further regions of the second layer;
    etching the uncovered further regions of the second layer thereby exposing further regions of the first layer; and
    removing remaining resist layer from over the second layer.

2. The method of claim 1, wherein the substrate comprises quartz.

3. The method of claim 1, wherein the phase shift material layer attenuates an incident light passing through it.

4. The method of claim 3, wherein the phase shift material layer shifts the phase of an incident light passing through it by about 180 degrees relative to an incident light that does not pass through it.

5. The method of claim 4, wherein the phase shift material layer has a transmittance of about 4%-40%.

6. The method of claim 3, wherein the phase shift material layer comprises a material selected from the group consisting of MoSiO, TaSiO, TiSiN, MoSiN, TaN, ZrSiO, and combinations thereof.

7. The method of claim 3, wherein the phase shift material layer comprises a stack of multiple material layers.

8. The method of claim 1, wherein the second layer comprises an opaque material layer.

9. The method of claim 8, wherein the opaque material layer comprises a material selected from the group consisting of chromium containing materials, molybdenum containing materials, and tantalum comprising materials.

10. The method of claim 1, wherein etching the resist layer, using an isotropic etch, comprises etching using etchants selected from the group consisting of $O_2$, HBr, $NF_3$, $SF_6$, and $CF_4$ and combinations thereof.

11. The method of claim 1, wherein the resist layer comprises a radiation sensitive material.

12. The method of claim 1, wherein forming the resist layer further comprises baking the resist layer after depositing the resist layer.

13. The method of claim 1, wherein forming the resist layer further comprises forming a second resist layer over a first resist layer, wherein the second resist layer is sensitive to radiation.

14. The method of claim 13, wherein the second resist layer is thinner than the first resist layer.

15. The method of claim 1, wherein forming the resist layer further comprises:
    forming a second resist layer over a first resist layer; and
    forming a third resist layer over the second resist layer, wherein the third resist layer is sensitive to radiation.

16. The method of claim 15, wherein the third resist layer is thinner than the first resist layer.

17. A method of manufacturing a lithography mask, the method comprising:
    disposing an attenuated phase shift material over a substrate;
    disposing an opaque material over the attenuated phase shift material, the opaque material physically contacting a top surface of the attenuated phase shift material;
    forming a resist layer over the opaque material;
    patterning the resist layer to uncover portions of the opaque material;
    etching the uncovered portions of the opaque material to reveal portions of the attenuated phase shift material;
    etching the revealed portions of the attenuated phase shift material to reveal portions of the substrate;
    trimming the resist layer using a isotropic plasma etch to uncover regions of the opaque material, wherein no additional lithographic exposure is performed to uncover the regions of the opaque material after patterning the resist layer;
    exposing regions of the attenuated phase shift material by removing only the uncovered regions of the opaque material; and
    removing remaining resist layer from over the opaque material.

18. The method of claim 17, wherein forming the resist layer further comprises forming a second resist layer over a first resist layer, wherein the second resist layer is sensitive to radiation.

19. The method of claim 17, wherein forming the resist layer further comprises:
    forming a second resist layer over a first resist layer; and
    forming a third resist layer over the second resist layer, wherein the third resist layer is sensitive to radiation.

20. The method of claim 17, wherein the opaque layer comprises a metallic layer.

21. The method of claim 17, wherein the attenuated phase shift material comprises a material selected from the group consisting of MoSiO, TaSiO, TiSiN, MoSiN, TaN, ZrSiO, and combinations thereof.

22. The method of claim 17, wherein the trimming the resist layer comprises etching using an isotropic etcher.

23. A method of manufacturing a semiconductor device, the method comprising:
   manufacturing a lithography mask by:
      forming a first layer over a substrate, the first layer being a phase shift material layer,
      forming a second layer over the first layer, the second layer physically contacting the first layer,
      forming a resist layer over the second layer,
      patterning the resist layer to uncover portions of the second layer,
      using the patterned resist layer as a mask to remove the uncovered portions of the second layer and then underlying portions of the first layer,
      etching the resist layer, using a partially isotropic plasma etch, to reveal further regions of the second layer,
      etching the revealed further regions of the second layer thereby exposing further regions of the first layer, and
      removing remaining resist layer from over the second layer;
   providing a workpiece having a layer of photosensitive material disposed thereon;
   patterning the photosensitive material using the lithography mask as a mask;
   forming a plurality of features on the workpiece using the patterned photosensitive material as a mask; and
   processing the workpiece to form the semiconductor device, wherein at least a portion of the semiconductor device comprises the plurality of features.

24. The method of claim 23, wherein the workpiece comprises a semiconductor substrate.

25. The method of claim 23, wherein the substrate comprises quartz.

26. The method of claim 23, wherein the phase shift material layer attenuates an incident light passing through it.

27. The method of claim 26, wherein the phase shift material layer comprises a material selected from the group consisting of MoSiO, TaSiO, TiSiN, MoSiN, TaN, ZrSiO, and combinations thereof.

28. The method of claim 23, wherein the second layer comprises an opaque material layer.

29. The method of claim 28, wherein the opaque material layer comprises a material selected from the group consisting of chromium containing materials, molybdenum containing materials, and tantalum comprising materials.

30. The method of claim 23, wherein the plurality of features comprise contact holes.

31. The method of claim 1, wherein a sidewall angle of a remaining second layer after etching the uncovered further regions of the second layer is less than 90 degree, wherein the sidewall angle is an angle enclosed between a bottom surface of the remaining second layer and a sidewall of the remaining second layer.

32. The method of claim 1, wherein a sidewall angle of the remaining resist layer after etching the resist layer is less than 90 degree, wherein the sidewall angle is an angle enclosed between a bottom surface of the remaining resist layer and a sidewall of the remaining resist layer.

33. The method of claim 17, wherein a first sidewall angle of the remaining resist layer after trimming the resist layer is less than 90 degree, wherein the first sidewall angle is an angle enclosed between a bottom surface of the remaining resist layer and a sidewall of the remaining resist layer, and wherein a second sidewall angle of a remaining opaque material after removing the uncovered regions of the opaque material is less than 90 degree, wherein the second sidewall angle is an angle enclosed between a bottom surface of the remaining opaque material and a sidewall of the remaining opaque material.

34. The method of claim 23, wherein a first sidewall angle of the remaining resist layer after etching the resist layer is less than 90 degree, wherein the first sidewall angle is an angle enclosed between a bottom surface of the remaining resist layer and a sidewall of the remaining resist layer, and wherein a second sidewall angle of a remaining second layer after etching the uncovered further region of the second layer is less than 90 degree, wherein the second sidewall angle is an angle enclosed between a bottom surface of the remaining second layer and a sidewall of the remaining second layer.

35. The method of claim 1, wherein the partial isotropic etch etches substantially more in a lateral direction than a vertical direction.

36. The method of claim 23, wherein no additional lithographic exposure is performed to reveal the further region of the second layer after patterning the resist layer.

37. The method of claim 1, wherein no additional lithographic exposure is performed in etching the resist layer after patterning the resist layer.

* * * * *